(12) United States Patent
Sohn (10) Patent No.: US 9,971,160 B2
(45) Date of Patent: May 15, 2018

(54) IMAGE SENSOR AND METHOD OF MANUFACTURING THE SAME

(71) Applicant: SAMSUNG ELECTRONICS CO., LTD., Suwon-si (KR)

(72) Inventor: Jinseung Sohn, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days. days.

(21) Appl. No.: 15/286,838

(22) Filed: Oct. 6, 2016

(65) Prior Publication Data

US 2017/0097510 A1 Apr. 6, 2017

(30) Foreign Application Priority Data

Oct. 6, 2015 (KR) ........................ 10-2015-0140609

(51) Int. Cl.
*H01L 27/146* (2006.01)
*G02B 27/10* (2006.01)

(52) U.S. Cl.
CPC .... *G02B 27/1013* (2013.01); *H01L 27/14621* (2013.01); *H01L 27/14685* (2013.01)

(58) Field of Classification Search
None
See application file for complete search history.

(56) References Cited

U.S. PATENT DOCUMENTS

| | | | |
|---|---|---|---|
| 8,378,440 B2 | 2/2013 | Kwon et al. | |
| 9,204,068 B2 | 12/2015 | Kokubun | |
| 2013/0270421 A1* | 10/2013 | Kanamori | G02B 23/24 250/208.1 |
| 2015/0365640 A1 | 12/2015 | Park et al. | |
| 2016/0109716 A1 | 4/2016 | Sohn | |

FOREIGN PATENT DOCUMENTS

| | | |
|---|---|---|
| JP | 2008-10760 A | 1/2008 |
| JP | 2008-53627 A | 3/2008 |

(Continued)

OTHER PUBLICATIONS

Jin-gang Liu, et al; "High refractive index polymers: fundamental research and practical applications"; Journal of Materials Chemistry; Aug. 6, 2009; pp. 8907-8919.

(Continued)

*Primary Examiner* — Whitney T Moore
(74) *Attorney, Agent, or Firm* — Sughrue Mion, PLLC (57) ABSTRACT

An image sensor including a color splitter and a method of manufacturing the image sensor is provided. The image sensor includes a photoelectric conversion layer; a plurality of color filters disposed on the photoelectric conversion layer; a light transmission layer disposed on the photoelectric conversion layer and the plurality of color filters; and a color splitter that is disposed on the light transmission layer, comprises a top surface and a side surface exposed to ambient air, and is configured to transmit a portion of light incident on the color splitter toward a first pixel region and refract a remaining portion of the incident light toward second pixel regions adjacent to the first pixel region, according to a difference between a refractive index of the color splitter and a refractive index of the ambient air.

14 Claims, 9 Drawing Sheets

(56) References Cited

FOREIGN PATENT DOCUMENTS

JP           2014-41921 A     3/2014
KR   10-2010-0083625 A     7/2010

OTHER PUBLICATIONS

Joseph Lik Hang Chau, et al; "Transparent high refractive index nanocomposite thin films"; Materials Letters, vol. 61; 2007; pp. 2908-2910.

Nishiwaki, et al., "Efficient colour splitters for high-pixel-density image sensors", Nature Photonics, Feb. 3, 2013, pp. 1-7, www.nature.com/naturephotonics.

* cited by examiner

IMAGE SENSOR AND METHOD OF MANUFACTURING THE SAME

CROSS-REFERENCE TO RELATED APPLICATION

This application claims priority from Korean Patent Application No. 10-2015-0140609, filed on Oct. 6, 2015 in the Korean Intellectual Property Office, the disclosure of which is incorporated herein in by reference its entirety.

BACKGROUND

1. Field

Apparatuses and methods consistent with exemplary embodiments relate to splitting a light incident onto an image sensor to separate color of the light.

2. Description of the Related Art

A color image sensor detects a color of light incident thereon via a color filter. The color image sensor may, for example, use a red green blue RGB color filter method. According to this method, green filters are arranged in two pixels and a blue filter and a red filter are respectively arranged in the remaining pixels in a pixel unit including four pixels. Except the RGB color filter method, a cyan yellow green magenta CYGM color filter method may also be used. In this case, color filters of cyan, yellow, green and magenta, which are complementary colors, are respectively arranged in four pixels.

However, the color filter may reduce the light utilization efficiency because lights of all colors except the corresponding color light are absorbed. For example, when the RGB color filter is used, since only one third of the incident light is transmitted and the remaining two thirds are absorbed, the light utilization efficiency may be as low as about 33%. Thus, in the color image sensor, most of the light loss occurs in the color filter.

Recently, attempts to use a color splitter have been made to improve the light utilization efficiency of the color image sensor. The color splitter may separate colors of light incident thereon according to a characteristic that diffraction or refraction of light is different depending on the wavelength of light. Colors separated by using the color splitter may be respectively transferred to corresponding pixels. Accordingly, the light utilization efficiency of the color image sensor may be improved when the color splitter is used, compared with a case when only the color filter is used.

SUMMARY

One or more exemplary embodiments provide an image sensor including a color splitter exposed to the air via a side surface and a top surface thereof.

Further, one or more exemplary embodiments provide manufacturing the image sensor.

According to an exemplary embodiment, there is provided an image sensor including: a photoelectric conversion layer; a plurality of color filters disposed on the photoelectric conversion layer; a light transmission layer disposed on the photoelectric conversion layer and the plurality of color filters; and a color splitter that is disposed on the light transmission layer, comprises a top surface and a side surface exposed to ambient air, and is configured to transmit a portion of light incident on the color splitter toward a first pixel region and refract a remaining portion of the incident light to second pixel regions adjacent to the first pixel region, according to a difference between a refractive index of the color splitter and a refractive index of the ambient air.

The refractive index of the color splitter may be about 1.4 to about 2.4.

The color splitter may include one of high refraction index materials from the group consisting of $SiN_x$, $TiO_2$, ZnS, and ZnSe, or an optical polymer including nanoparticles of the high refraction index materials dispersed in the optical polymer.

The plurality of color filters may include a plurality of color filters units, each of the plurality of color filters including one red color filter, two green color filters, and one blue color filter arranged in a 2×2 array, and the two green color filters arranged in a diagonal direction in the 2×2 array, the color splitter comprises a plurality of color splitters, each arranged in each of the green color filters, and each of the plurality of color splitters transmits green color light from among the incident light and directs the remaining portion of the incident light to adjacent blue color filter or red color filter.

The color splitter may include a plurality of color splitters arranged in a predetermined color pixel regions of the plurality of pixel regions, each of the plurality of color splitters includes a first element on a surface of the light transmission layer, and a second element on the first element, wherein the second element is shifted inwardly from the first element toward a center of the plurality of pixel regions.

The plurality of color filters may include a plurality of color filters units, each of the plurality of color filters including one red color filter, two green color filters, and blue color filter arranged in a 2×2 array, and the two of green color filters is arranged in a diagonal direction in the 2×2 array, and the color splitter has a mesh shape arranged in diagonal directions connecting the green color filters.

The color splitter may include a first element having a mesh shape arranged in the diagonal direction connecting the green color filters; and a second element on the first element, the second element having the mesh shape and shifted inwardly from the first element in a direction toward a center of the plurality of pixels.

According to an aspect of another exemplary embodiment, there is provided a manufacturing method of an image sensor including: forming a plurality of color filters on a photoelectric conversion layer; forming a light transmission layer on the photoelectric conversion layer to cover the plurality of color filters; and forming a color splitter on the light transmission layer, the color splitter comprising a top surface and a side surface exposed to ambient air and being configured to transmit a portion of light incident on the color splitter toward a first pixel region and refract a remaining portion of the incident light toward second pixel regions adjacent to the first pixel region, according to a difference between a refractive index of the color splitter and a refractive index of the ambient air.

The forming of the color splitter may include: forming a sacrificial layer on the light transmission layer; patterning the sacrificial layer to form a through-hole in the sacrificial layer; filling the through-hole with an optical polymer material by spin coating the optical polymer; removing the optical polymer material disposed on the sacrificial layer to expose the optical polymer material filled in the through-hole to ambient air; and removing the sacrificial layer to form the optical polymer material remaining on the light transmission layer as the color splitter.

The forming the color splitter may include: forming a first sacrificial layer on the light transmission layer; patterning the first sacrifice layer to form a first through-hole in the first sacrificial layer; filling the first through-hole with a first optical polymer material by spin coating the first optical polymer material; removing the first optical polymer material disposed on the first sacrificial layer to expose the first optical polymer material filled in the first through-hole to ambient air; forming a second sacrificial layer on the first sacrificial layer to cover the first optical polymer material filled in the first through-hole; patterning the second sacrificial layer to form a second through-hole in the second sacrificial layer; filling the second through-hole with a second optical polymer material by spin coating the second optical polymer material; removing the second optical polymer material disposed on the second sacrificial layer to expose the second optical polymer material filled in the second through-hole to the ambient air; and removing the first and second sacrificial layers to form the first optical material remaining on the light transmission layer as a first element of the color splitter and to form the second optical material remaining on the first element as a second element of the color splitter.

BRIEF DESCRIPTION OF THE DRAWINGS

The above and/or other aspects will be more apparent by describing certain exemplary embodiments, with reference to the accompanying drawings, in which.

DETAILED DESCRIPTION

Exemplary embodiments are described in greater detail below with reference to the accompanying drawings.

In the following description, like drawing reference numerals are used for like elements, even in different drawings. The matters defined in the description, such as detailed construction and elements, are provided to assist in a comprehensive understanding of the exemplary embodiments. However, it is apparent that the exemplary embodiments can be practiced without those specifically defined matters. Also, well-known functions or constructions are not described in detail since they would obscure the description with unnecessary detail.

It will be understood that when a component, such as a layer, a film, a region, or a plate, is referred to as being "on" another component, the component can be not only be directly on the other component with a contact but also be on the other component without no contact.

Figure 1:
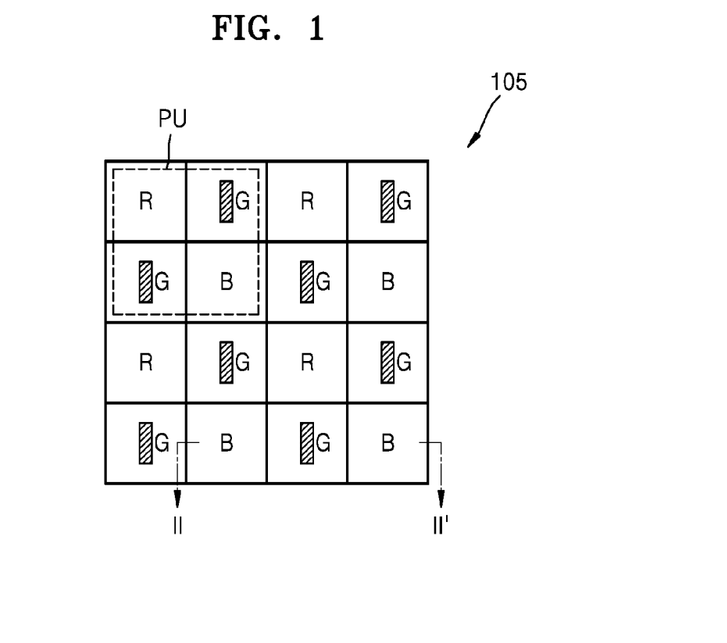
FIG. 1 is a plan view of a pixel array of an image sensor according to an exemplary embodiment.
Figure 2:
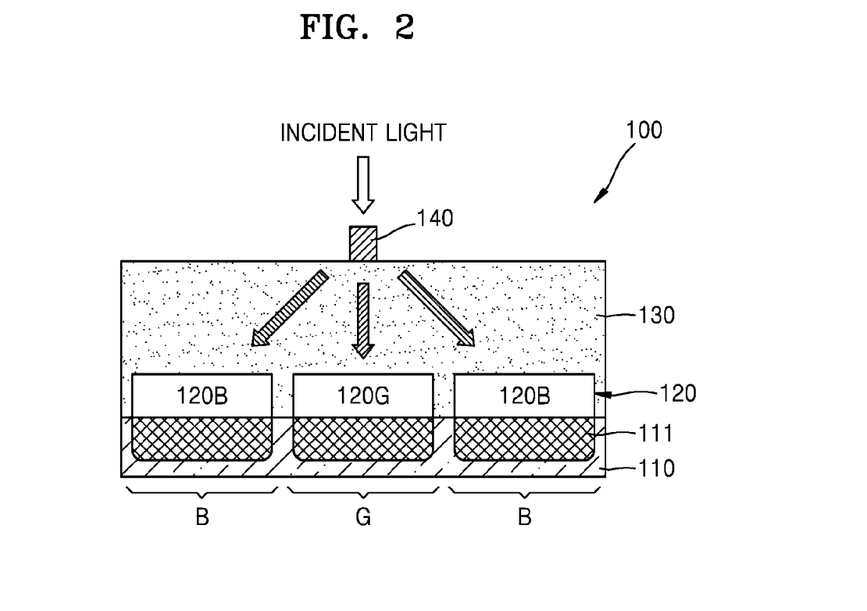
FIG. 2 is a cross-sectional view of FIG. 1 taken along a line of II-II'.

FIG. 1 is a plan view of a pixel array 105 of an image sensor 100 according to an exemplary embodiment, and FIG. 2 is a cross-sectional view of FIG. 1 taken along a line of II-II'.

Referring to FIG. 1, the pixel array 105 may include a plurality of pixel units PU arranged in an array. The pixel unit PU may include two green color pixels G, one red color pixel R, and one blue color pixel B. Pixels R, G, and B may be respectively denoted as pixel regions R, G, and B. In addition, pixels R, G, and B may be respectively denoted as filter regions R, G, and B.

The pixel array 105 of FIG. 1 has a Bayer pattern. However, the exemplary embodiment is not limited thereto. For example, locations of the pixels R, G, and B may be different from the arrangement in FIG. 1. In addition, the pixel unit PU may include cyan, yellow, green, and magenta pixels.

The image sensor 100 of the exemplary embodiment may include a color splitter 140 formed in each of the green pixels G.

Referring to FIG. 2, the image sensor 100 may include a plurality of color filters 120 arranged on a photoelectric conversion layer 110. A light transmission layer 130 covering the plurality of color filters 120 may be formed on the photoelectric conversion layer 110. The color splitter 140 may be arranged on the light transmission layer 130.

The photoelectric conversion layer 110 may include a plurality of photoelectric conversion regions 111 corresponding to a plurality of color pixels R, G, and B. The photoelectric conversion layer 110 may be a silicon layer doped with a first-type impurity, and the photoelectric conversion region 111 may be doped with a second-type impurity. When the first-type impurity is an n-type impurity, the second-type impurity may be a p-type impurity. When the first-type impurity is a p-type impurity, the second-type impurity may be an n-type impurity.

Each color filter 120 may transmit a color light thereof and block light of other colors. For example, a green color filter 120G may transmit a light having a band of wavelengths corresponding to green color, and may block a light beyond the band of wavelengths corresponding to green color. A blue color filter 120G may transmit a light having a band of wavelengths corresponding to blue color, and may block a light beyond the band of wavelengths corresponding to blue color. The color filters 120 may be arranged to be separate from each other to avoid color crosstalk therebetween. Only a green color filter 120G and a blue color filter 120B are illustrated in FIG. 2

The light transmission layer 130 may provide a path for light split in the color splitter 140 to reach a corresponding pixel.

The light transmission layer 130 may include $SiO_2$ or spin-on glass (SOG). The light transmission layer 130 may be designed such that light split from the color splitter 140 is directed toward the color filter 120 of the corresponding pixel.

The color splitter 140 may be formed so that a bottom surface thereof is in contact with the light transmission layer 130. The color splitter 140 may be fixed to the light transmission layer 130 in a baking process during the manufacturing of the image sensor 100. A side surface and a top surface of the color splitter 140 may be exposed to air. The color splitter 140 may include a material having a refraction index greater than that of air. The color splitter 140 may include a material with the refraction index of about 1.4 to about 2.4. For example, the color splitter 140 may include $SiN_x$, $TiO_2$, ZnS, ZnSe, etc.

The color splitter 140 may be manufactured of a material capable of spin coating. For example, the color splitter 140 may include an optical polymer. The optical polymer may include polymethyl methacrylate PMMA, epoxy resin, 2-methoxy-1-methylethyl acetate, phenyl methyl siloxane polymer, etc. In addition, the color splitter 140 may be an optical polymer including dispersed nanoparticles of a high refraction index material having a refraction index greater than about 1.5. The high refraction index material may include $SiN_x$, $TiO_2$, ZnS, ZnSe, etc.

An operation of the image sensor 100 will be described below with reference to FIG. 2.

Light incident on the image sensor 100 may be split into green color light and other color light, for example, magenta light, while passing through the color splitter 140. The magenta light includes red color light and blue color light. The green color light among light incident on the green color pixel G may not change its direction and may enter the green color filter 120G. Other light may be slantly refracted in the color splitter 140 and enter adjacent regions, that is, the blue color filter 120B of the blue color pixel B. The other light may enter the red color pixel R depending on a location of the color splitter 140.

Accordingly, in the green color pixel G, only about 33% of the incident light may be transmitted to the green color filter 120 and enter the photoelectric conversion region 111 therebeneath. On the other hand, in the red color pixel R as well as the blue color pixel B, the magenta light refracted from the color splitter 140 on the adjacent green color pixel G may further enter thereto, in addition to light incident on the corresponding pixel. Thus, the light utilization efficiency in the red color pixel R as well as the blue color pixel B may increase.

A conventional color splitter may require a certain level of difference in a refraction index with respect to a surrounding material thereof having a relatively low refraction index. In the exemplary embodiment, since air, which has a relatively lower refraction index, exists around the color splitter 140, the color splitter 140 according to the exemplary embodiment may include a material with a refraction index less than that of the conventional color splitter.

In addition, when the color splitter 140 is formed of the same material as the conventional color splitter, the color splitter 140 may be formed in a relatively smaller size. A reduction in a height of the color splitter 140 may enable a miniaturization of the image sensor 100.

An arrangement of the pixel array 105 of the image sensor 100 and an arrangement of the color splitter 140 illustrated in FIGS. 1 and 2 are examples for the sake of understanding of the current disclosure. However, the exemplary embodiment is not limited to the examples illustrated in FIGS. 1 and 2. A color splitting characteristic may be variously selected depending on a design of the color splitter 140, and a structure of the pixel array 105 may be variously selected depending on the color splitting characteristic of the color splitter 140.

Figure 3:
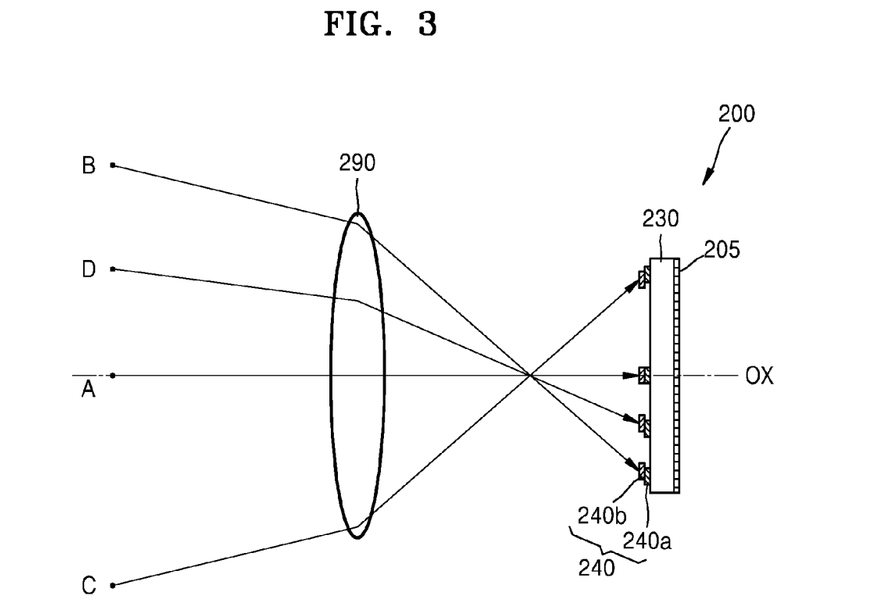
FIG. 3 is a diagram showing a schematic structure of an image sensor according to another exemplary embodiment.

FIG. 3 is a diagram showing a schematic structure of an image sensor 200 according to another exemplary embodiment. Components which are identical to those in FIGS. 1 and 2 will be indicated via the same reference numbers and a detailed description thereof will be omitted.

Referring to FIG. 3, an object lens 290 may be arranged in front of an image sensor 200. The image sensor 200 may include a pixel array 205, and a light transmission layer 230 on the pixel array 205, and a color splitter 240 on the pixel array 205. The pixel array 205 may include a photoelectric conversion layer and color filters. A plurality of color splitters 240 may be arranged on the light transmission layer 230. The plurality of color splitters 240 may be formed in a green color pixel region G as illustrated in FIG. 1. The color splitter 240 may be formed in a two-story structure. In other words, the color splitter 240 may include a first element 240*a* disposed on the light transmission layer 230 and a second element 240*b* disposed on the first element 240*a*.

The object lens 290 may have a role of focusing an image of an object onto the image sensor 200. Light originating from a point of the object may pass through the object lens 290 and be incident on a point on the image sensor 200. For example, light originating from a point A on an optical axis OX of the object lens 290 may pass through the object lens 290 and be incident on a center point of the image sensor 200 on the optical axis OX. In addition, lights originating from points B, C, or D in a direction away from the optical axis OX may pass through the object lens 290, traverse the optical axis OX due to the object lens 290, and be incident on points away from the center point of the image sensor 200. For example, light originating from the point B above the optical axis OX may traverse the optical axis OX and be incident on a lower point of the image sensor 200, and light originating from the point C below the optical axis OX may traverse the optical axis OX and be incident on an upper point of the image sensor 200. In addition, light originating from the point D located between the optical axis OX and the point B may be incident on a point between the center of the image sensor 200 and the lower point thereof.

Thus, each light originating from points A, B, C, and D different from each other may be incident on the image sensor 200 at different angles depending on a distance between each of points A, B, C, and D and the optical axis OX. Light originating from the point A on the optical axis OX has an incident angle of 0 degree with respect to the optical axis OX and is perpendicularly incident on the image sensor 200. As light originating from points farther away from the optical axis OX, incident angles with respect to the optical axis OX increase.

The structure of color splitter 240 may have a directivity. Due to the directivity, the color splitter 240 may efficiently function for perpendicular light but, when the incident angle becomes greater than a predetermined angle, the color splitting efficiency of the color splitter 240 may drastically decrease. Accordingly, when color splitters 240 with an identical structure may be arranged on an entire region of the image sensor 200, the quality of an image may be poorer as a distance from a center portion of the image sensor 200 becomes greater.

The pixel array 205 according to another exemplary embodiment may include a color splitter 240 with a multiple-story structure to obtain efficient color splitting at edges of the image sensor 200.

Figure 4A:
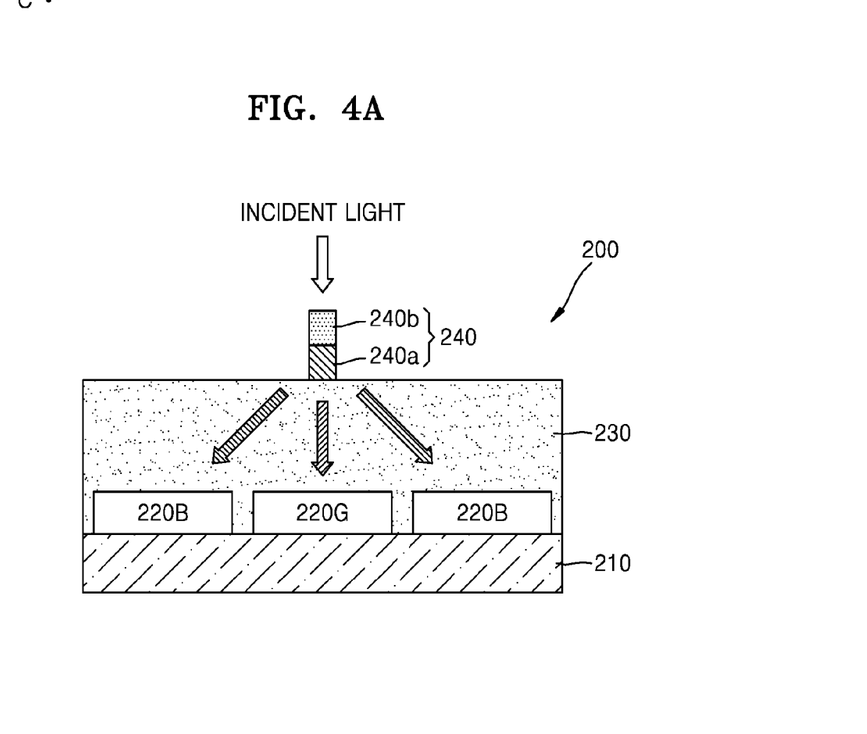
FIGS. 4A, 4B, and 4C are schematic cross-sectional views showing structures of a color splitter in accordance with locations thereof, according to another exemplary embodiment.
Figure 4B:
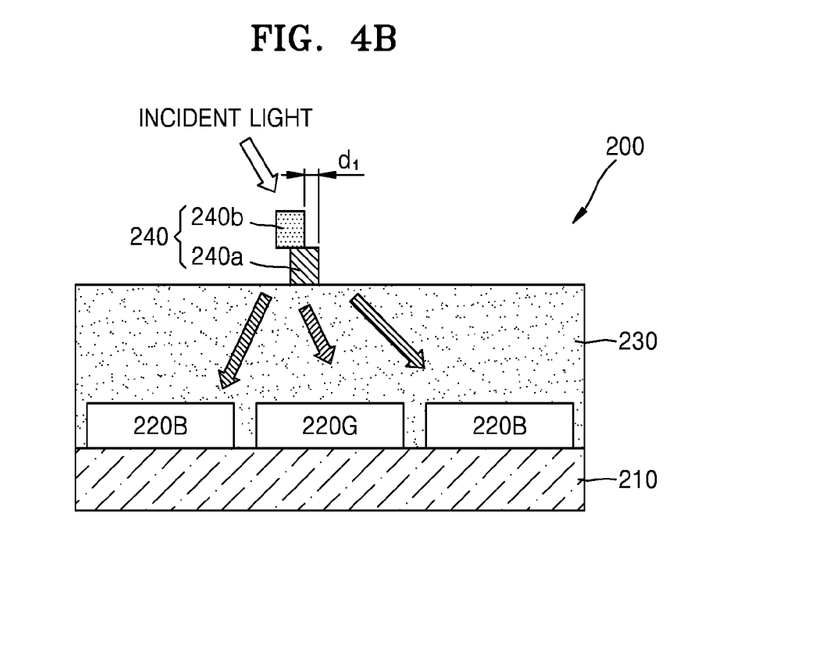
Figure 4C:
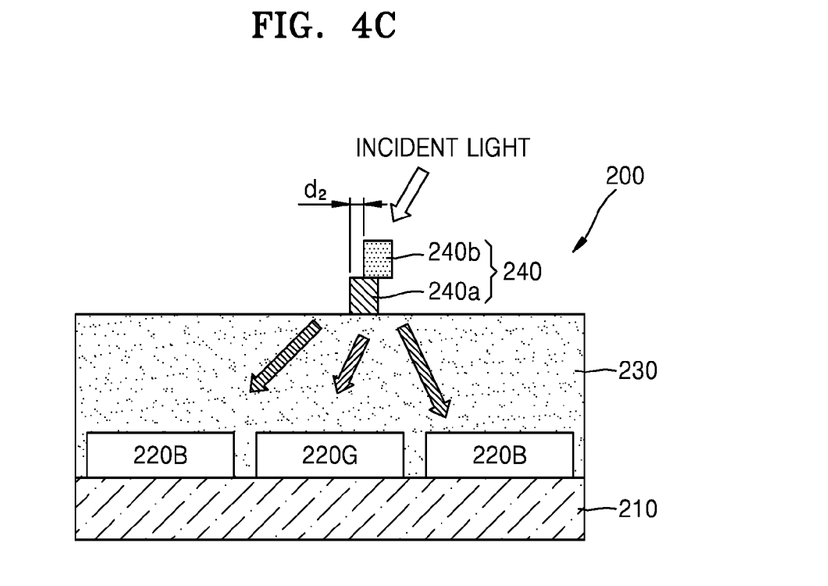

FIGS. 4A through 4C are schematic cross-sectional views showing structures of the color splitter 240 in accordance with locations of the color splitter 240, according to another exemplary embodiment. The pixel array 205 of the image sensor 200 may be identical with that in FIG. 1 and only the structure of the color splitter 240 is different. Structures of FIGS. 4A through 4C may be interpreted in relation to cross-sectional views along a line II-II' in FIG. 1. Components identical with those in FIG. 2 will be indicated with identical reference numbers and a detailed description thereof will be omitted. The photoelectric conversion region is not illustrated in FIGS. 4A through 4C for the sake of convenience.

FIG. 4A is an exemplary cross-sectional view illustrating in detail a location relation between the first and second elements 240a, 240b of the color splitter 240 when light is perpendicularly incident on the image sensor 200, and FIGS. 4B and 4C are exemplary cross-sectional views illustrating in detail the location relationship between the first and second elements 240a, 240b of the color splitter 240 when light is slantly incident on the image sensor 200.

Referring to FIG. 4A, when the incident light is perpendicularly incident on the image sensor 200, the first and second elements 240a, 240b are not shifted from each other. In this case, the first and second elements 240a, 240b may be arranged such that center lines of the first and second elements 240a, 240b coincide along a center line of a corresponding pixel.

Referring to FIGS. 4B and 4C, when the incident light is slantly incident on the image sensor 200, the first and second elements 240a, 240b may be shifted from each other. The first and second elements 240a, 240b may be shifted from each other to be aligned with a travelling direction of slantly incident light.

For example, as illustrated in FIG. 4B, when light is slantly incident from a left side, the second element 240b may be relatively further shifted to the left with respect to the first element 240a. A relative shift distance d1 between the first and second elements 240a, 240b may increase as an incident angle of the incident light increases.

In addition, as illustrated in FIG. 4C, when light is slantly incident from a right side, the second element 240b may be relatively further shifted to the right with respect to the first element 240a. A relative shift distance d2 between the first and second elements 240a, 240b may increase as the incident angle of the incident light increases.

As described above, when the incident light is perpendicularly incident on the image sensor 200, the color splitter 240 may be arranged along the center line of the corresponding pixel. However, when the incident light is slantly incident on the image sensor, the first and second elements 240a, 240b as a whole may be arranged to be shifted toward the incident direction of light, and the first and second elements 240a, 240b may be relatively shifted from each other.

The image sensor 200, according to another exemplary embodiment, may have a uniform color characteristic in the entire region thereof since a variation in the color splitting efficiency in accordance with a change in the incident angle of light on the image sensor 200 may not be significant.

Figure 5:
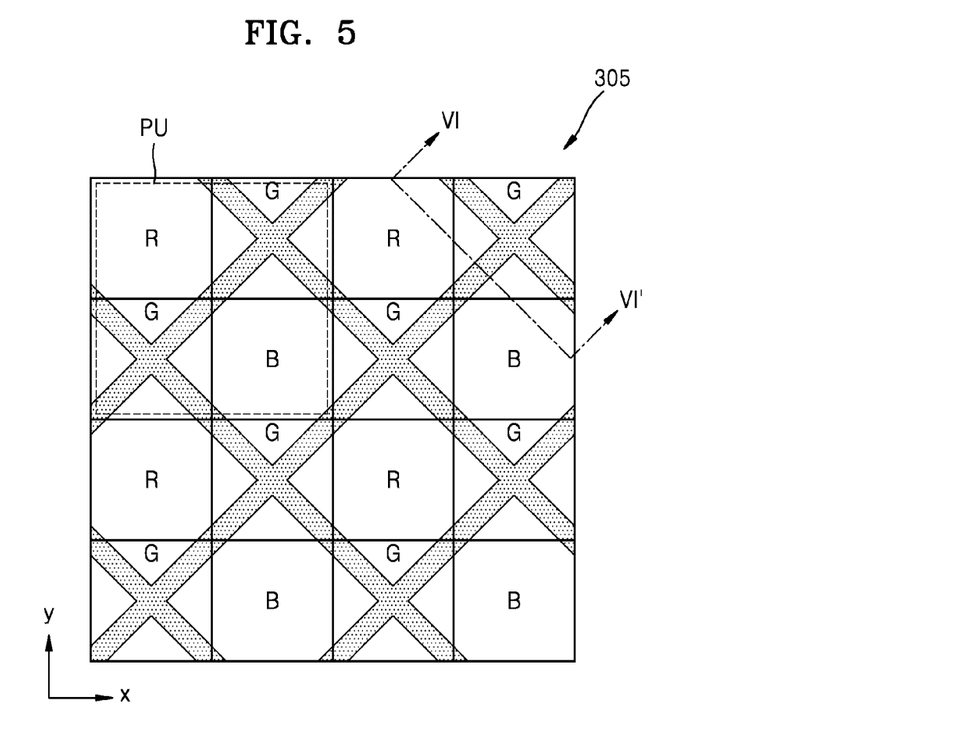
FIG. 5 is a plan view of a pixel array of an image sensor according to another exemplary embodiment.
Figure 6:
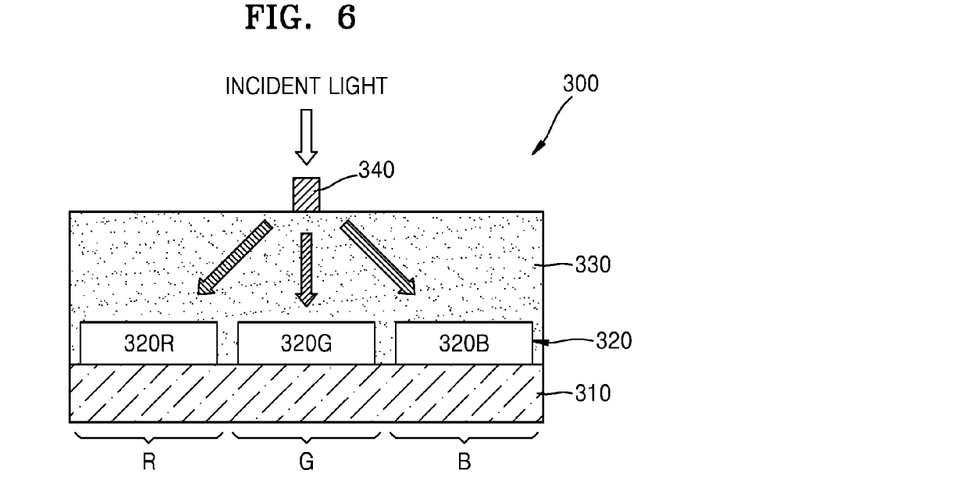
FIG. 6 is a cross-sectional view of FIG. 5 taken along a line of VI-VI'.

FIG. 5 is a plan view of a pixel array 350 of an image sensor 300 according to another exemplary embodiment, and FIG. 6 is a cross-sectional view of FIG. 5 taken along a line of VI-VI'.

Referring to FIG. 5, the image sensor 300 may include a plurality of pixel units PU arranged in an array. The pixel unit PU may include two green color pixels G, one red color pixels R, and one blue color pixels B. An arrangement of FIG. 5 is a Bayer pattern. However, the exemplary embodiment is not limited thereto. For example, locations of color pixels R, G, and B may be different from the arrangement in FIG. 5. In addition, the pixel unit PU may include cyan, yellow, green and magenta pixels.

A color splitter 340 may be formed to traverse the green color pixels G. The color splitter 340 may have a mesh shape.

Referring to FIG. 6, a plurality of color filters 320 may be arranged on a photoelectric conversion layer 310. A plurality of photoelectric conversion regions, not illustrated, may be formed under the photoelectric conversion layer 310. A light transmission layer 330 covering the plurality of color filters 320 may be formed on the photoelectric conversion layer 310. The color splitter 340 having the mesh shape may be arranged on the light transmission layer 330.

The color splitter 340 may be formed so that a bottom surface thereof contacts the light transmission layer 330. The color splitter 340 may be fixed to the light transmission layer 330 in a baking process during the manufacturing of the image sensor 300. A side surface and a top surface of the color splitter 340 may be exposed to air. The color splitter 340 may include a material having a refraction index greater than that of air. The color splitter 340 may include a material having the refraction index of about 1.4 to about 2.4. For example, the color splitter 340 may include $SiN_x$, $TiO_2$, ZnS, ZnSe, etc.

The color splitter 340 may be manufactured of a material capable of spin coating.

Light incident on the image sensor 300 may be split into green color light and other color light, for example, magenta light, while passing through the color splitter 340. Magenta light includes red color light and blue color light. Green color light among light incident on the green color pixel region G may not change direction and may enter the green color filter 320G, and other magenta light may be slantly refracted in the color splitter 340 and enter adjacent regions, that is, the red color pixel region R and the blue color pixel region B.

Regarding the image sensor 300 according another exemplary embodiment, an amount of light incident on the red color pixel region R as well as the blue color pixel region B may increase, and thus, the light utilization efficiency may increase.

The color splitter 340 of the image sensor 300 according to another exemplary embodiment may be fixed to a wider area of the light transmission layer 330 compared with the color splitters 140 and 240, and thus, may be structurally more stable.

Figure 7:
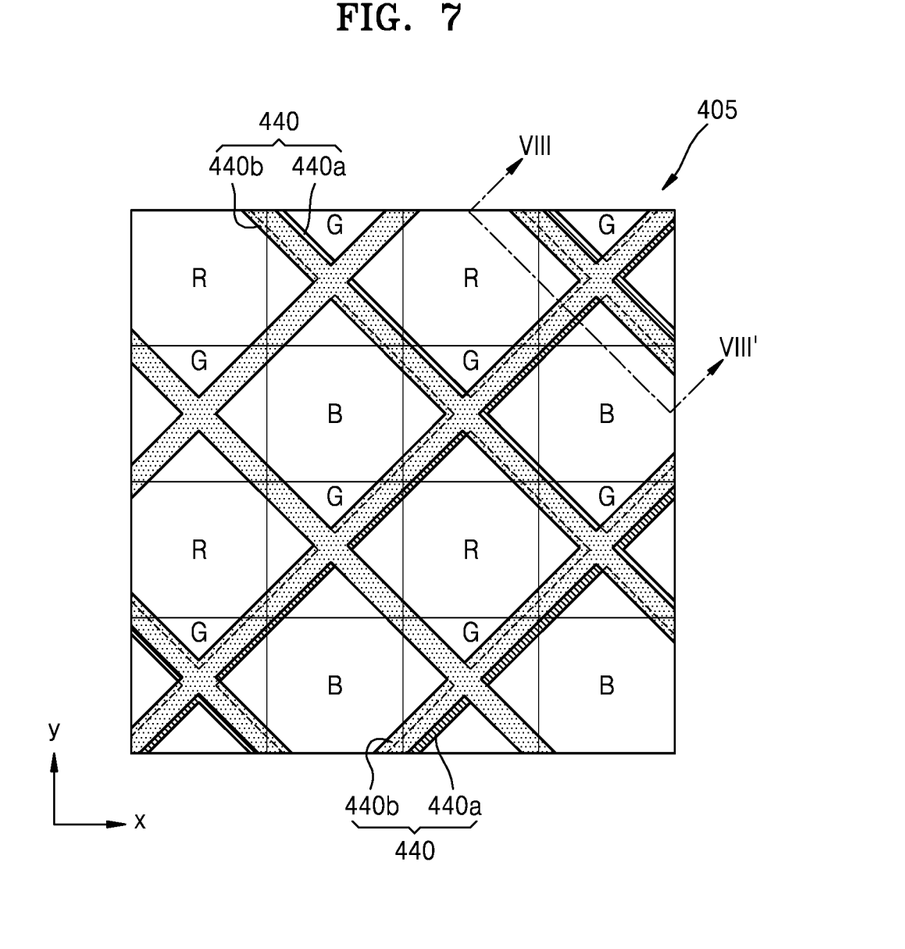
FIG. 7 is a plan view of a pixel array of an image sensor according to another exemplary embodiment.
Figure 8:
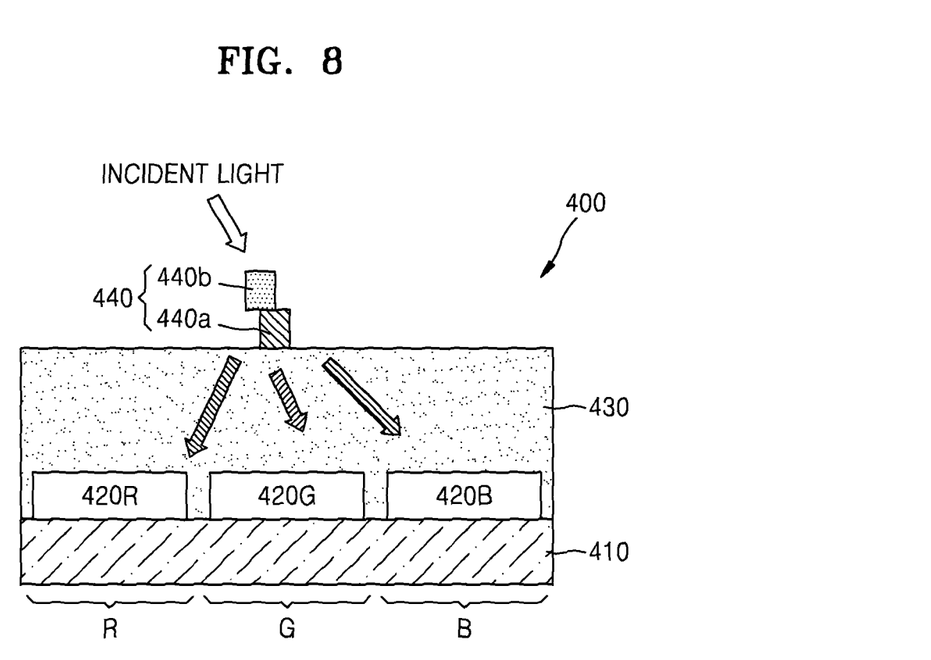
FIG. 8 is a cross-sectional view of FIG. 7 taken along a line of VIII-VIII'.

FIG. 7 is a plan view of a pixel array 405 of an image sensor 400 according to another exemplary embodiment, and FIG. 8 is a cross-sectional view of FIG. 7 taken along a line of VIII-VIII'. Components identical to those in FIGS. 5 and 6 will be indicated using the same reference numbers and a detailed description thereof will be omitted.

Referring to FIG. 7, the image sensor 400 may include a plurality of pixel units PU arranged in an array. The pixel unit PU may include two green color pixels G, one red color pixel R, and one blue color pixel B. An arrangement of FIG. 7 is a Bayer pattern. However, the exemplary embodiment is not limited thereto. For example, locations of color pixels R, G, and B may be different from the arrangement in FIG. 7. In addition, the pixel unit PU may include cyan, yellow, green and magenta pixels.

Referring to FIG. 8, the color splitter 440 may include a first element 440a in contact with a top surface of the light transmission layer 430 and a second element 440b arranged on the first element 440a. The second element 440b is in contact with the first element 440a. The second element 440b may be positioned to completely overlap the first element 440a at a center location (location A in FIG. 3) of the image sensor 400. The color splitter 440 including the first and second elements 440a, 440b may have a bottom surface in contact with the light transmission layer 430 and may also have a side surface and a top surface exposed to air.

Referring to FIG. 7 again, the first element 440a of the color splitter 440 may be formed to traverse the green color pixel G. The first element 440a of the color splitter 440 may have a mesh shape.

The region A is the center region of the image sensor 440. The color splitter 440 traversing the region A may have a structure in which the first and second elements 440a and 440b are overlapped as shown in FIG. 4A.

On the other hand, the color splitter 440 separated from the region A may have the second element 440b shifted from the first element 440a. As a distance between the location of the color splitter 440 from the region A becomes greater, a separation distance of the second element 440b shifted from the first element 440a may increase.

A lower surface of the first element 440a of the color splitter 440 may be in contact with the light transmission layer 430. The color splitter 440 may be fixed to the light transmission layer 430 in a baking process during the manufacturing of the image sensor 400. A side surface of the first element 440a and a side surface and a top surface of the second element 440b of the color splitter 440 may be exposed to air. A top surface of the first element 440a may be covered by the second element 440b or a portion of the top surface of the first element 440a may be exposed to the air.

The color splitter 440 may include a material having a refraction index greater than that of air. The color splitter 440 may include a material having the refraction index of about 1.4 to about 2.4. For example, the color splitter 440 may include $SiN_x$, $TiO_2$, ZnS, ZnSe, etc.

The color splitter 440 may be manufactured of a material capable of spin coating.

The operation of the image sensor 400 may be well known from the exemplary embodiments above and a detailed description in this regard will be omitted.

FIGS. 9A through 9G are cross-sectional views describing, step by step, a method of manufacturing the image sensor 200 of FIG. 4B. Components which are identical to those in FIG. 4B will be indicated via the same reference numbers and a detailed description will be omitted.

Figure 9A:
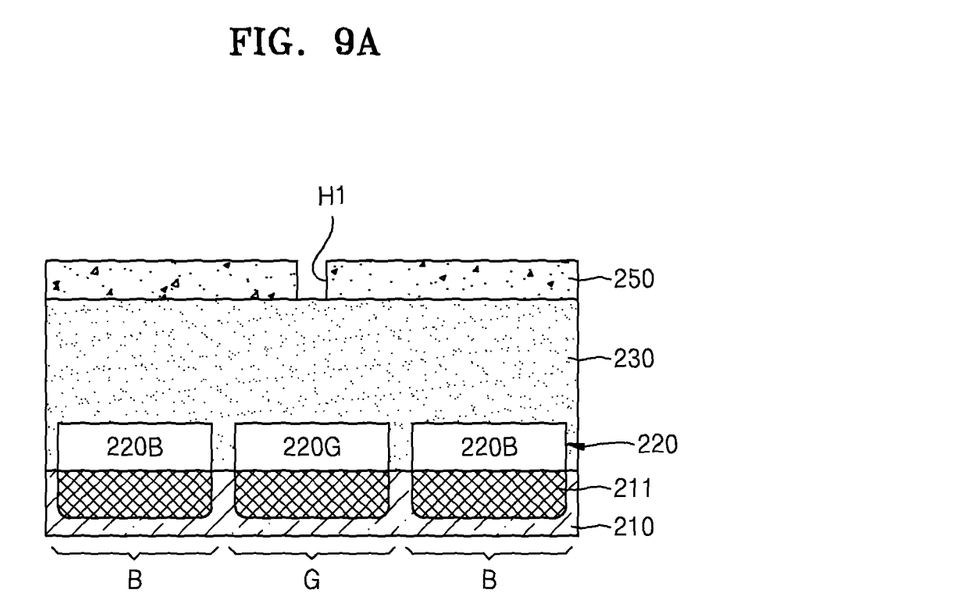
FIGS. 9A, 9B, 9C, 9D, 9E, 9F, and 9G are cross-sectional views illustrating, step by step, a method of manufacturing the image sensor of FIG. 4B, according to another exemplary embodiment.

Referring to FIG. 9A, firstly, a photoelectric conversion layer 210 may be formed. The photoelectric conversion layer 210 may include a plurality of the photoelectric conversion regions 211 formed correspondingly to a plurality of pixel regions. The photoelectric conversion layer 210 may be a silicon layer doped with a first type impurity, and a plurality of the photoelectric conversion region 211 may be formed by doping a second type impurity in the pixel regions.

A plurality of color filters 220 may be formed on the photoelectric conversion layer 210. The color filter 220 may be formed on the photoelectric conversion region 211 in accordance with the photoelectric conversion region 211.

The light transmission layer 230 covering the color filters 220 may be formed in a direction toward the photoelectric conversion layer 210. The light transmission layer 230 may be formed of materials having relatively low refraction indices. For example, the light transmission layer 230 may include silicon oxide, etc.

The first sacrificial layer 250 may be formed on the light transmission layer 230. The first sacrificial layer 250 may be formed of photoresist or resin.

Then, a first hole H1 may be formed, which corresponds to a first element (240a in FIG. 9C) of the color splitter, by patterning the first sacrificial layer 250. The first hole H1 may be formed by penetrating the first sacrificial layer 250.

Figure 9B:
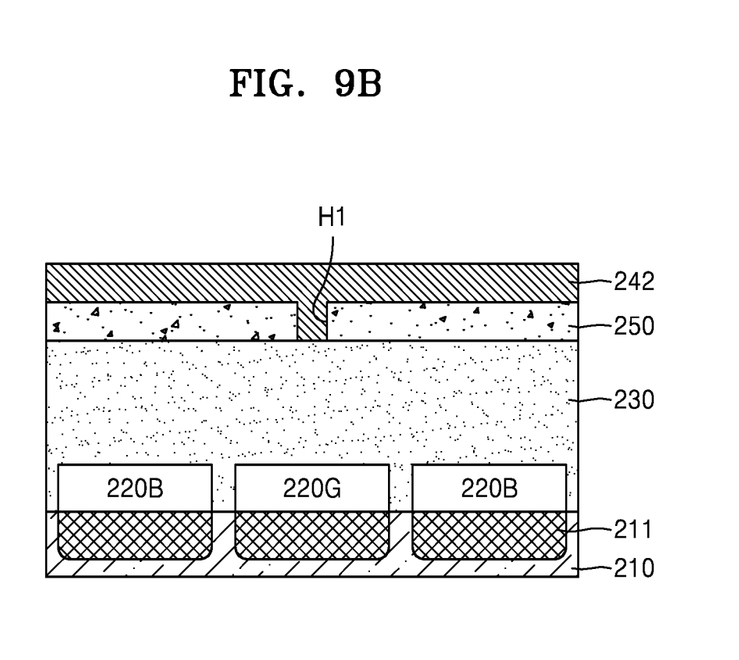

Referring to FIG. 9B, the first hole H1 may be filled with a material for forming the color splitter 240. For example, the first hole H1 may be filled by spin coating with a solution mixed with a first optical polymer 242 and an organic solvent such as ethanol. The first optical polymer 242 may be a material having a refraction index of about 1.4 to about 3.2. The first optical polymer 242 may be an optical polymer including dispersed nanoparticles having a relatively high refraction index material such as $SiN_x$, $TiO_2$, ZnS, and ZnSe. The first optical polymer 242 may be hardened in the baking process. The optical polymer may include polymethyl methacrylate PMMA, epoxy resin, 2-methoxy-1-methylethyl acetate, phenyl methyl siloxane polymer, etc.

Figure 9C:
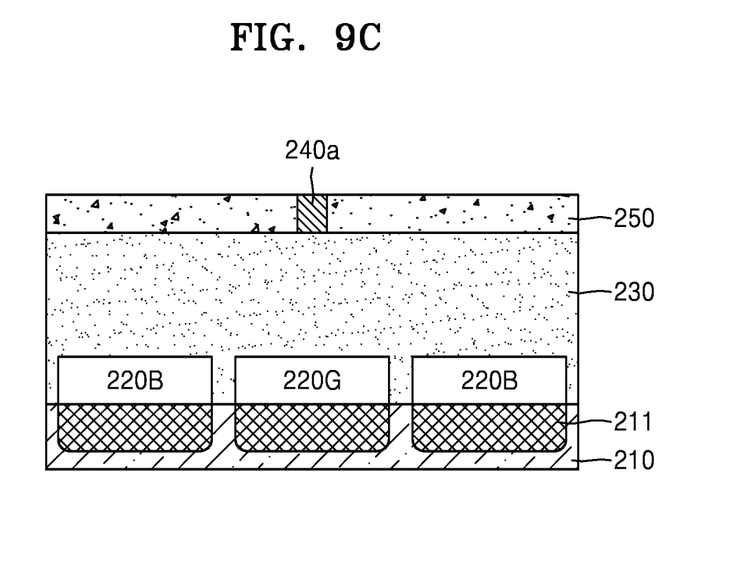

Referring to FIG. 9C, the first sacrificial layer 250 may be exposed by etchback or by polishing, for example, by chemical mechanical polishing (CMP) of the first optical polymer 242. In this case, the first hole H1 may be maintained in a state wherein the first optical polymer 242 is filled therein.

Figure 9D:
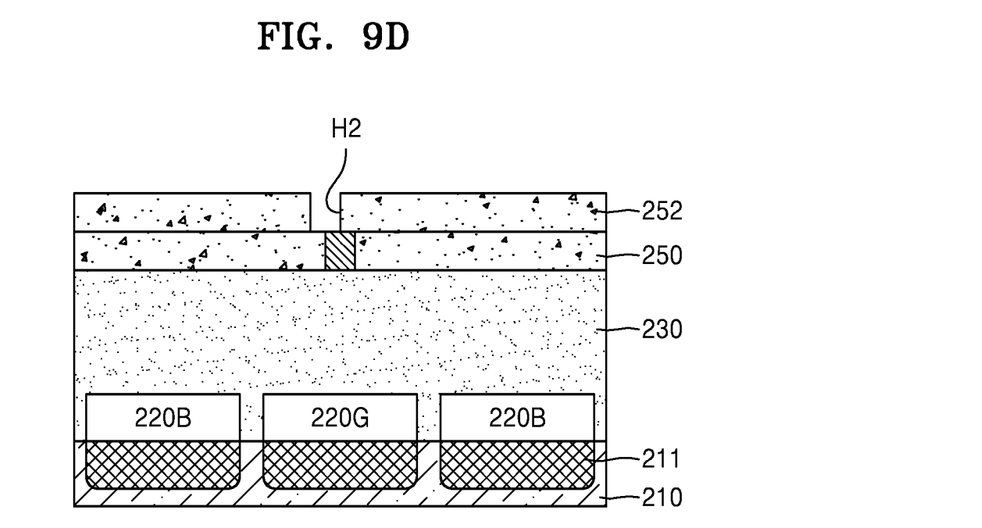

Referring to FIG. 9D, a second sacrificial layer 252 may be formed on the first sacrificial layer 250 to cover the first photo polymer. The second sacrificial layer 252 may be formed of an identical material as the first sacrificial layer 250. Then, the second sacrificial layer 252 may be patterned such that a region where a second element (240b in FIG. 9F) of the color splitter is formed, may be exposed. A second hole H2 may be formed in the second sacrificial layer 252. The second hole H2 may be formed at the same position as the first hole H1 or may be formed to be shifted from the first hole H1. The second hole H2 may be formed to be connected with the first hole H1. A shift distance between the first hole H1 and the second hole H2 may be different depending on the location of corresponding pixel and may be well understood from descriptions about FIGS. 4B and 4C, and thus, a detailed description will be omitted.

Figure 9E:
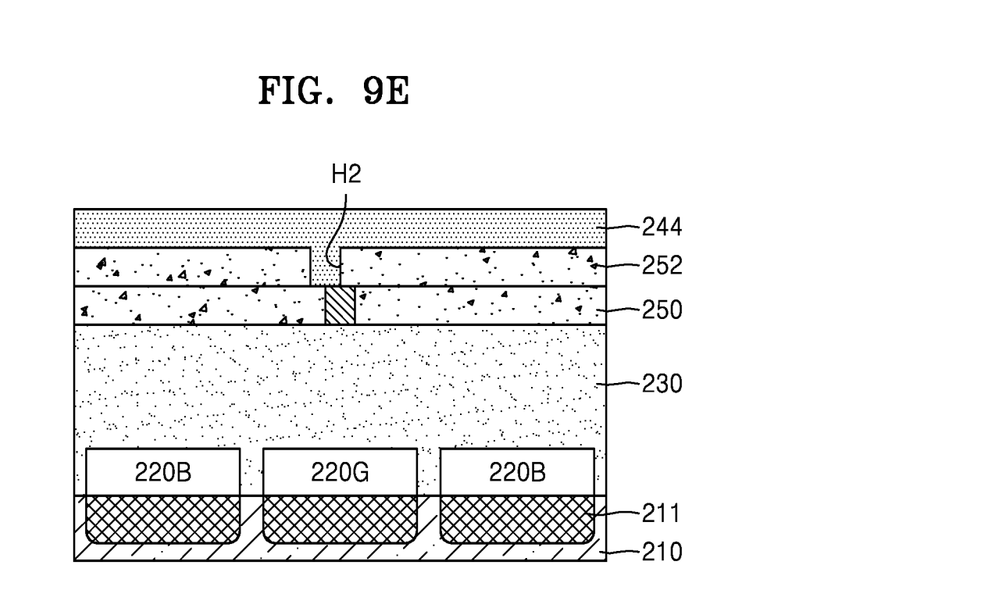

Referring to FIG. 9E, a second optical polymer 244 may be applied to cover a surface of the second sacrificial layer 252 by a spin coating process. The second optical polymer 244 may include an organic solvent. The second optical polymer 244 may formed of an identical material as the first optical polymer 242. The second optical polymer 244 may be filled in the second hole H2 and may be hardened in the baking process.

Figure 9F:
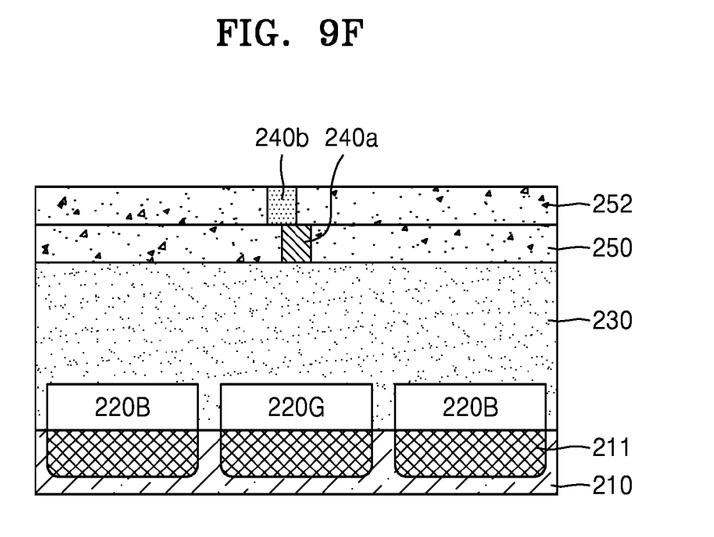

Referring to FIG. 9F, the second sacrificial layer 252 may be exposed by removing a portion of the second optical polymer 244 by using the etchback process or the CMP process. In this case, the second hole H2 may be maintained in a state of being filled in with the second optical polymer 244.

Figure 9G:
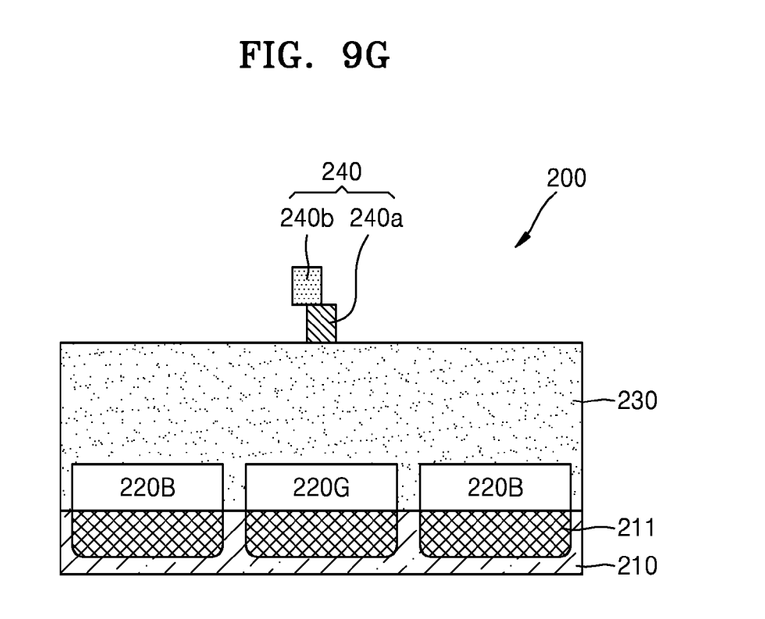

Referring to FIG. 9G, the sacrificial layers 250 and 252 may be removed by either a wet process or a dry process, which completes the manufacturing of the image sensor 200.

The image sensor 100 of FIG. 2 may be manufactured by removing the sacrificial layer 250 in the process of FIG. 9C. Regarding the image sensor 300 of FIG. 6, the first hole H1 may have the same shape as that of the color splitter 340 in FIG. 5. The image sensor 300 of FIG. 6 may be manufactured by removing the sacrificial layer in the process of FIG. 9c.

In a method of manufacturing the image sensor 400 of FIG. 8, the first hole H1 and the second hole H2 may have the same shapes as those in the color splitter 440 in FIG. 7. Also, other processes may be well understood from the descriptions above, and thus, a detailed description will be omitted.

According to the exemplary embodiments as described above, the color splitter 240 may be easily formed via the spin coating process, instead of performing a deposition process inside a chamber such as chemical vapor deposition (CVD) or physical vapor deposition (PVD). Thus, the image sensor 200 including the color splitter 240 may be easily manufactured by using very simple equipment via an easy process.

In addition, the etchback process may be stopped when the sacrificial layer with a wide area begins to appear, and thus, a time to stop the etchback process may be exactly known.

The foregoing exemplary embodiments are merely exemplary and are not to be construed as limiting. The present teaching can be readily applied to other types of apparatuses. Also, the description of the exemplary embodiments is intended to be illustrative, and not to limit the scope of the claims, and many alternatives, modifications, and variations will be apparent to those skilled in the art.

What is claimed is:

1. An image sensor comprising:
   a photoelectric conversion layer;
   a plurality of color filters disposed on the photoelectric conversion layer;
   a light transmission layer disposed on the photoelectric conversion layer and the plurality of color filters; and
   a color splitter that is disposed on the light transmission layer, comprises a top surface and a side surface exposed to ambient air, and is configured to transmit a portion of light incident on the color splitter toward a first pixel region and refract a remaining portion of the incident light to second pixel regions adjacent to the first pixel region, according to a difference between a refractive index of the color splitter and a refractive index of the ambient air, wherein
   the plurality of color filters comprise a plurality of color filters units, each of the plurality of color filters units including one red color filter, two green color filters, and one blue color filter arranged in a two-by-two array, and the two green color filters arranged in a diagonal direction in the two-by-two array,
   the color splitter comprises a plurality of color splitters, each arranged in each of the green color filters, and
   each of the plurality of color splitters transmits a green color light from among the incident light and directs the remaining portion of the incident light to adjacent blue color filter or red color filter.

2. The image sensor of claim 1, wherein the refractive index of the color splitter is about 1.4 to about 2.4.

3. The image sensor of claim 2, wherein the color splitter includes one of high refraction index materials from a group consisting of $SiN_x$, $TiO_2$, ZnS, and ZnSe, or an optical polymer including nanoparticles of the high refraction index materials dispersed in the optical polymer.

4. The image sensor of claim 1,
   wherein each of the plurality of color splitters includes a first element disposed on a surface of the light transmission layer, and a second element disposed on the first element, and
   wherein the second element is shifted inwardly from the first element toward a center of the plurality of pixel regions.

5. The image sensor of claim 1, wherein the color splitter has a mesh shape arranged in diagonal directions connecting the green color filters.

6. The image sensor of claim 5, wherein the color splitter comprises:
   a first element having a mesh shape arranged in a diagonal direction connecting the green color filters; and
   a second element disposed on the first element, and having the mesh shape and shifted inwardly from the first element in a direction toward a center of the plurality of pixels.

7. A method of manufacturing an image sensor, the method comprising:
   forming a plurality of color filters on a photoelectric conversion layer;
   forming a light transmission layer on the photoelectric conversion layer to cover the plurality of color filters; and
   forming a color splitter on the light transmission layer, the color splitter comprising a top surface and a side surface exposed to ambient air and being configured to transmit a portion of light incident on the color splitter toward a first pixel region and refract a remaining portion of the incident light toward second pixel regions adjacent to the first pixel region, according to a difference between a refractive index of the color splitter and a refractive index of the ambient air,
   wherein the forming of the color splitter comprises:
      forming a sacrificial layer on the light transmission layer;
      patterning the sacrificial layer to form a through-hole in the sacrificial layer;
      filling the through-hole with an optical polymer material by spin coating the optical polymer;
      removing the optical polymer material disposed on the sacrificial layer to expose the optical polymer material filled in the through-hole to ambient air; and
      removing the sacrificial layer to form the optical polymer material remaining on the light transmission layer as the color splitter.

8. The method of manufacturing the image sensor of claim 7, wherein the forming of the color splitter comprises forming the color splitter to have a refractive index of about 1.4 to about 2.4.

9. The method of manufacturing the image sensor of claim 8, wherein the forming of the color splitter comprises forming the color splitter including an optical polymer including one of a high refraction index material selected from a group consisting of $SiN_x$, $TiO_2$, ZnS, and ZnSe or an optical polymer nanoparticles of the high refraction index materials dispersed in the optical polymer.

10. The method of manufacturing the image sensor of claim 7, wherein the forming the plurality of color filters comprises forming a plurality of color filters units, each of the plurality of color filters units including one red color filter, two green color filters, and one blue color filter arranged in a two-by-two array, and the two green color filters arranged in a diagonal direction in the two-by-two array,
   the color splitter comprises a plurality of color splitters, each arranged in each of the green color filters, and
   each of the plurality of color splitters transmits a green color light from among the incident light and directs the remaining portion of the incident light to adjacent blue color filter or red color filter.

11. The method of manufacturing the image sensor of claim 7, wherein the forming the plurality of color filters comprises forming a plurality of color filters units, each of the plurality of color filters units including one red color filter, two green color filters, and blue color filter arranged in a two-by-two array, and the two of green color filters is arranged in a diagonal direction in the two-by-two array, and
   the color splitter has a mesh shape arranged in diagonal directions connecting the green color filters.

12. A method of manufacturing an image sensor, the method comprising:
- forming a plurality of color filters on a photoelectric conversion layer;
- forming a light transmission layer on the photoelectric conversion layer to cover the plurality of color filters; and
- forming a color splitter on the light transmission layer, the color splitter comprising a top surface and a side surface exposed to ambient air and being configured to transmit a portion of light incident on the color splitter toward a first pixel region and refract a remaining portion of the incident light toward second pixel regions adjacent to the first pixel region, according to a difference between a refractive index of the color splitter and a refractive index of the ambient air, wherein the forming the color splitter comprises:
- forming a first sacrificial layer on the light transmission layer;
- patterning the first sacrifice layer to form a first through-hole in the first sacrificial layer;
- filling the first through-hole with a first optical polymer material by spin coating the first optical polymer material;
- removing the first optical polymer material disposed on the first sacrificial layer to expose the first optical polymer material filled in the first through-hole to ambient air;
- forming a second sacrificial layer on the first sacrificial layer to cover the first optical polymer material filled in the first through-hole;
- patterning the second sacrificial layer to form a second through-hole in the second sacrificial layer;
- filling the second through-hole with a second optical polymer material by spin coating the second optical polymer material;
- removing the second optical polymer material disposed on the second sacrificial layer to expose the second optical polymer material filled in the second through-hole to the ambient air; and
- removing the first and second sacrificial layers to form the first optical material remaining on the light transmission layer as a first element of the color splitter and to form the second optical material remaining on the first element as a second element of the color splitter.

13. The method of manufacturing the image sensor of claim 12, wherein the forming the color splitter comprises forming a plurality of color splitters arranged in a predetermined color pixel region of a plurality of pixel regions, and the second element is formed to be shifted inwardly from the first element toward a center of the plurality of pixel regions.

14. The method of manufacturing the image sensor of claim 12, wherein the forming the plurality of color filters comprise forming a plurality of color filters units, each of the plurality of color filters units including one red color filter, two green color filters, and one blue color filter arranged in a two-by-two array, and the two of green color filters is arranged in a diagonal direction in the two-by-two array,
- each of the first element and second element has a mesh shape arranged in diagonal directions connecting the green color filters, and
- the second element is formed to be shifted inwardly from the first element toward a center of a plurality of pixel regions.

* * * * *